US012642118B2

(12) United States Patent
Mashino

(10) Patent No.: US 12,642,118 B2
(45) Date of Patent: May 26, 2026

(54) SEMICONDUCTOR DEVICE

(71) Applicant: SHINKO ELECTRIC INDUSTRIES CO., LTD., Nagano (JP)

(72) Inventor: Naohiro Mashino, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 416 days.

(21) Appl. No.: 18/357,385

(22) Filed: Jul. 24, 2023

(65) Prior Publication Data

US 2024/0047329 A1 Feb. 8, 2024

(30) Foreign Application Priority Data

Aug. 3, 2022 (JP) ................................. 2022-124345

(51) Int. Cl.
*H10W 70/685* (2026.01)
*H10W 70/05* (2026.01)
(Continued)

(52) U.S. Cl.
CPC ......... *H10W 70/685* (2026.01); *H10W 70/05* (2026.01); *H10W 74/114* (2026.01); *H10W 90/794* (2026.01)

(58) Field of Classification Search
CPC ........... H01L 23/49822; H01L 21/4857; H01L 23/3135; H10W 70/685; H10W 70/05;
(Continued)

(56) References Cited

U.S. PATENT DOCUMENTS

2016/0064299 A1* 3/2016 Lakhera .............. H01L 23/3135
438/126
2017/0033086 A1 2/2017 Homma et al.
(Continued)

FOREIGN PATENT DOCUMENTS

JP 2017-034086 2/2017
JP 2018-107435 7/2018
JP 2019-140215 8/2019

OTHER PUBLICATIONS

Office Action mailed on Mar. 24, 2026 with respect to the corresponding Japanese patent application No. 2022-124345.

*Primary Examiner* — Evan G Clinton
(74) *Attorney, Agent, or Firm* — IPUSA, PLLC

(57) ABSTRACT

A semiconductor device includes a first inorganic insulating layer, a metal post embedded in the first inorganic insulating layer, a semiconductor chip mounting part stacked on the first inorganic insulating layer, and a second inorganic insulating layer. The metal post has first and second end faces that are exposed in the first and second opposite surfaces, respectively, of the first inorganic insulating layer. The semiconductor chip mounting part has first and second opposite surfaces and a side surface connecting the first and second opposite surfaces of the semiconductor chip mounting part. The first surface of the semiconductor chip mounting part contacts the second surface of the first inorganic insulating layer. The second inorganic insulating layer covers the entirety of the second surface and the entirety of the side surface of the semiconductor chip mounting part. The second inorganic insulating layer is continuous with the first inorganic insulating layer.

9 Claims, 6 Drawing Sheets

1

(51) Int. Cl.
  *H10W 74/10*       (2026.01)
  *H10W 90/00*       (2026.01)

(58) Field of Classification Search
  CPC ............. H10W 74/114; H10W 90/794; H10W
            74/014; H10W 74/019; H10W 74/121;
            H10P 72/7418; H10P 72/7424; H10P
                      72/743; H10P 72/74
  See application file for complete search history.

(56)                 References Cited

U.S. PATENT DOCUMENTS

2018/0182683  A1      6/2018  Val et al.
2020/0058571  A1*     2/2020  Wang .................. H01L 23/3128
2022/0052667  A1*     2/2022  Carpenter .............. H03H 9/564

* cited by examiner

400

C 11b 300x C
11
11a 11c 300 130 120 110
100

C 11b C
11
11a 11c 130 120 110
100

C 11b C
11
11a 11c 12 130 120 110
100

C 11b 12b C
11
11a 11c 12a 12 130 120 110
100

SEMICONDUCTOR DEVICE

CROSS-REFERENCE TO RELATED APPLICATION

This application is based upon and claims priority to Japanese Patent Application No. 2022-124345, filed on Aug. 3, 2022, the entire contents of which are incorporated herein by reference.

FIELD

A certain aspect of the embodiment discussed herein is related to semiconductor devices.

BACKGROUND

In recent years, semiconductor devices with various configurations have been proposed. As an example of a semiconductor device, Japanese Laid-open Patent Publication No. 2019-140215 illustrates a recording and communication module. It is preferable to impart a moisture-proof effect to semiconductor devices because semiconductor devices have an area sensitive to humidity. According to the above-noted semiconductor device, the moisture-proof effect is imparted through a polymer deposition film of a para-xylylene compound.

SUMMARY

According to an embodiment, a semiconductor device includes a first inorganic insulating layer, a metal post embedded in the first inorganic insulating layer, a semiconductor chip mounting part stacked on the first inorganic insulating layer, and a second inorganic insulating layer. The metal post has first and second end faces that are exposed in the first and second opposite surfaces, respectively, of the first inorganic insulating layer. The semiconductor chip mounting part has first and second opposite surfaces and a side surface connecting the first and second opposite surfaces of the semiconductor chip mounting part. The first surface of the semiconductor chip mounting part contacts the second surface of the first inorganic insulating layer. The second inorganic insulating layer covers the entirety of the second surface and the entirety of the side surface of the semiconductor chip mounting part. The second inorganic insulating layer is continuous with the first inorganic insulating layer.

The object and advantages of the invention will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1:
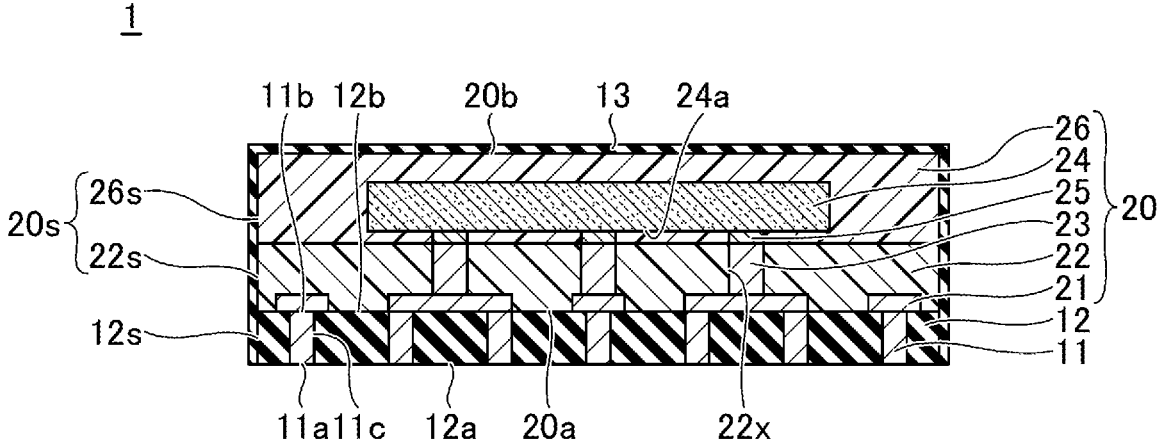
FIG. 1 is a sectional view of a semiconductor device according to an embodiment.

Semiconductor devices are required to have a better moisture-proof effect.

According to an embodiment, a semiconductor device having a better moisture-proof effect and a better gas barrier property is provided.

An embodiment of the present invention is described below with reference to the accompanying drawings. The same elements are referred to using the same reference numeral and a duplicate description thereof may be omitted.

FIG. 1 is a sectional view of a semiconductor device according to an embodiment. Referring to FIG. 1, a semiconductor device 1 includes metal posts 11, an inorganic insulating layer 12, an inorganic insulating layer 13, and a semiconductor chip mounting part 20 that includes an encapsulating resin layer 26.

According to this embodiment, for convenience, the encapsulating resin layer 26 side of the semiconductor device 1 is referred to as "upper side," and the inorganic insulating layer 12 side of the semiconductor device 1 is referred to as "lower side." Furthermore, with respect to each part or element of the semiconductor device 1, a surface on the encapsulating resin layer 26 side is referred to as "upper surface," and a surface on the inorganic insulating layer 12 side is referred to as "lower surface." The semiconductor device 1, however, may be used in an inverted position or oriented at any angle. Furthermore, a plan view refers to a view of an object taken in a direction normal to the upper surface of the encapsulating resin layer 26, and a planar shape refers to the shape of an object as seen from a direction normal to the upper surface of the encapsulating resin layer 26.

Each of the metal posts 11 has a first end face 11a, a second end face 11b, and a side surface 11c connecting the first end face 11a and the second end face 11b. The metal posts 11 may be formed of metal such as copper (Cu) or a copper alloy. According to each metal post 11, the first end face 11a and the second end face 11b are, for example, parallel. Furthermore, the first end face 11a and the second end face 11b are, for example, perpendicular to the side surface 11c. The first end face 11a is exposed to the outside of the semiconductor device 1, and may be used as an external connection terminal.

According to each metal post 11, the first end face 11a and the second end face 11b have, for example, circular shapes that are substantially equal in area. When the first end face 11a and the second end face 11b are circular, the first end face 11a and the second end face 11b are, for example, approximately 1 μm to approximately 20 μm in diameter. The metal posts 11 are, for example, approximately 1 μm to approximately 20 μm in height. The metal posts 11 have, for example, a pitch of approximately 1 μm to approximately 100 μm.

The inorganic insulating layer 12 has a first surface 12a in which the first end faces 11a of the metal posts 11 are exposed and a second surface 12b in which the second end faces 11b of the metal posts 11 are exposed, and covers the side surfaces 11c of the metal posts 11. The first surface 12a of the inorganic insulating layer 12 may be, for example, flush with the first end faces 11a of the metal posts 11. The second surface 12b of the inorganic insulating layer 12 may be, for example, flush with the second end faces 11b of the metal posts 11. The roughness of the second surface 12b of the inorganic insulating layer 12 may be, for example, an arithmetic average roughness (Ra) of approximately 100 nm or less. Flattening the second surface 12b of the inorganic insulating layer 12 by reducing its roughness facilitates formation of fine-pitch interconnects on the second surface 12b of the inorganic insulating layer 12.

The inorganic insulating layer 12 may be formed by chemical vapor deposition (CVD), using silica ($SiO_2$), silicon oxycarbide (SiOC) or the like, for example. Hereinafter, a layer formed by CVD may be referred to as "CVD layer." The inorganic insulating layer 12 may also be formed by atomic layer deposition (ALD), using hafnia ($HfO_2$), titania ($TiO_2$), zirconia ($ZrO_2$) or the like, for example. Hereinafter, a layer formed by ALD may be referred to as "ALD layer."

The inorganic insulating layer 12 may be a composite layer that is a laminate of ALD and CVD layers. The composite layer may have either a two-layer structure where a CVD layer and an ALD layer are stacked in layers or a three-layer structure where a CVD layer is sandwiched between ALD layers. When the inorganic insulating layer 12 is a composite layer that is a laminate of ALD and CVD layers, the thickness of an ALD layer may be, for example, approximately 10 nm to approximately 20 nm, and the rest is the CVD layer. When the inorganic insulating layer 12 is a composite layer that is a laminate of ALD and CVD layers, an ALD layer may be thinner than a CVD layer.

According to the embodiment, the term "inorganic insulating layer" means an insulating layer in which inorganic materials account for 80 wt % or more of all the materials of the insulating layer. For example, when an insulating layer contains 0.7 wt % of SiOC and 99.3 wt % of $SiO_2$, the insulating layer is an inorganic insulating layer.

The semiconductor chip mounting part 20 is stacked on the second surface 12b of the inorganic insulating layer 12 such that a lower surface 20a (first surface) of the semiconductor chip mounting part 20 contacts the second surface 12b. The semiconductor chip mounting part 20 includes a wiring layer 21, an insulating layer 22, a wiring layer 23, a semiconductor chip 24, and the encapsulating resin layer 26.

The wiring layer 21 is stacked on the second surface 12b of the inorganic insulating layer 12 to be electrically connected to the second end faces 11b of the metal posts 11. The wiring layer 21 is the lowermost (bottommost) wiring layer in the semiconductor chip mounting part 20. The thickness of the wiring layer 21 may be, for example, approximately 0.5 μm or more and approximately 3 μm or less. The line and space (L/S) of the wiring layer 21 may be, for example, approximately 1 μm/1 μm to approximately 5 μm/5 μm. Examples of materials for the wiring layer 21 include copper and a copper alloy.

The "line" of the line and space represents the width of an interconnect (interconnect width) and the "space" of the line and space represents the interval between adjacent interconnects (interconnect interval). For example, a line and space of 1 μm/1 μm to 5 μm/5 represents an interconnect width of 1 μm or more and 5 μm or less and an interconnect interval of 1 μm or more and 5 μm or less. The interconnect width and the interconnect interval do not necessarily have to be equal.

The insulating layer 22 is stacked on the second surface 12b of the inorganic insulating layer 12. The insulating layer 22 covers the wiring layer 21, which is the lowermost wiring layer. The insulating layer 22 is the lowermost insulating layer in the semiconductor chip mounting part 20. One or more insulating layers and one or more wiring layers may be further provided on the insulating layer 22. The material of the insulating layer 22 may be composed mainly of, for example, a photosensitive resin such as a photosensitive phenolic or polyimide resin. The material of the insulating layer 22 may also be composed mainly of, for example, a non-photosensitive resin such as a non-photosensitive epoxy, imide, phenolic, or cyanate resin or an inorganic material in the form of a CVD film (for example, 0.5 μm to 5 μm in thickness) or the like. The insulating layer 22 may contain a filler such as silica. The thickness of the insulating layer 22 may be, for example, approximately 0.5 μm to approximately 40 μm. Via holes 22x are so formed in the insulating layer 22 as to pierce through the insulating layer 22 to expose the upper surface of the wiring layer 21. The via holes 22x may be, for example, approximately 15 μm or more and approximately 20 μm or less in diameter.

The wiring layer 23 includes via interconnects filling in the via holes 22x. The upper surface of the wiring layer 23 is exposed in the upper surface of the insulating layer 22. The upper surface of the wiring layer 23 may be, for example, flush with the upper surface of the insulating layer 22. Examples of materials for the wiring layer 23 include copper.

The semiconductor chip 24 includes a thin semiconductor substrate formed of silicon or the like (not depicted). A semiconductor integrated circuit (not depicted), electrodes 25 electrically connected to the semiconductor integrated circuit, etc., are formed in a surface of the semiconductor substrate (hereinafter "circuit-formation surface 24a"). The electrodes 25 are, for example, copper pads.

The semiconductor chip 24 is disposed on the uppermost (topmost) insulating layer in the semiconductor chip mounting part 20. The electrodes 25 are electrically connected to the uppermost wiring layer in the semiconductor chip mounting part 20. According to the example illustrated in FIG. 1, the uppermost insulating layer is the insulating layer 22 and the uppermost wiring layer is the wiring layer 23. That is, according to the example illustrated in FIG. 1, the semiconductor chip 24 is provided on the insulating layer 22 and the electrodes 25 are electrically connected to the upper surface of the wiring layer 23 exposed in the upper surface of the insulating layer 22. The electrodes 25 and the wiring layer 23 may be directly connected by, for example, diffusion bonding or indirectly connected via solder bumps or the like. In the latter case (indirect connection), examples of materials for solder bumps include alloys containing lead (Pb), Sn (tin)-Cu alloys, Sn—Ag (silver) alloys, and Sn—Ag—Cu alloys.

The encapsulating resin layer 26 is disposed on the uppermost insulating layer positioned under the semiconductor chip 24 to cover the semiconductor chip 24. According to the example illustrated in FIG. 1, the uppermost insulating layer is the insulating layer 22. The encapsulating resin layer 26 covers the bottom surface (the surface on the side opposite from the circuit-formation surface 24a) and the side surface of the semiconductor chip 24 and fills in the gap between the circuit-formation surface 24a of the semiconductor chip 24 and the upper surface of the insulating layer 22. Examples of materials for the encapsulating resin layer 26 include a mold resin. The mold resin is an insulating resin composed mainly of a non-photosensitive, thermosetting resin and usable for transfer molding, compression molding, injection molding, etc. The mold resin is, for example, an insulating resin such as a non-photosensitive, thermosetting epoxy resin and may contain a filler.

The inorganic insulating layer 13 covers the entirety of an upper surface 20b (second surface) and the entirety of a side surface 20s of the semiconductor chip mounting part 20 and is continuous with the inorganic insulating layer 12. In other words, the inorganic insulating layer 13 continuously covers a side surface 12s of the inorganic insulating layer 12, a side surface 22s of the insulating layer 22, and an upper surface and a side surface 26s of the encapsulating resin layer 26. The upper surface of the encapsulating resin layer 26, namely, the surface of the encapsulating resin layer 26 facing away from the insulating layer 22, defines the upper surface 20b of the semiconductor chip mounting part 20. The side surface 12s of the inorganic insulating layer 12 connects the first surface 12a and the second surface 12b of the inorganic insulating layer 12. The side surface 20s of the semiconductor chip mounting part 20 connects the upper surface 20b and the lower surface 20a of the semiconductor chip mounting part 20. The material of the inorganic insulating layer 13 may be the same as the material of the inorganic insulating layer 12. The inorganic insulating layer 13 may have either a two-layer structure where a CVD layer and an ALD layer are stacked in layers or a three-layer structure where a CVD layer is sandwiched between ALD layers.

Figure 2A:
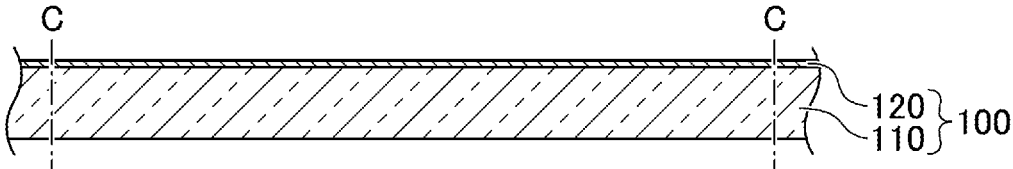
FIGS. 2A through 2N are diagrams illustrating a process of manufacturing a semiconductor device according to the embodiment.

Next, a method of manufacturing a semiconductor device according to this embodiment is described. FIGS. 2A through 2N are diagrams illustrating a process of manufacturing a semiconductor device according to this embodiment. In FIGS. 2A through 2N, C indicates positions at which cutting is to be performed to separate the semiconductor device as an individual piece (hereinafter referred to as "separation positions C"). According to this embodiment, a process in which multiple parts (parts each sandwiched between adjacent separation positions C) to become semiconductor devices are manufactured on a support and are thereafter separated into individual semiconductor devices is illustrated. The process, however, may be such that one semiconductor device is manufactured on the support.

First, in the process illustrated in FIG. 2A, a support 100 having metal foil as an outermost layer is prepared. The support 100 may include, for example, a base 110 and metal foil with carrier (hereinafter "carrier-attached metal foil") 120 stacked on the base 110. The thickness of the support 100 may be, for example, approximately 9 µm to approximately 100 µm. For example, glass, metal, ceramic or the like may be used for the base 110. The carrier-attached metal foil 120 includes thick foil (carrier foil), a release layer on the thick foil, and thin foil on the release layer. The thick foil is famed of foil of metal such as copper and has a thickness of approximately 10 µm to approximately 50 µm. The thin foil is foiled of foil of metal such as copper and has a thickness of approximately 1.5 µm to approximately 5 µm. The thin foil is removably attached onto the thick foil via the release layer.

Figure 2B:
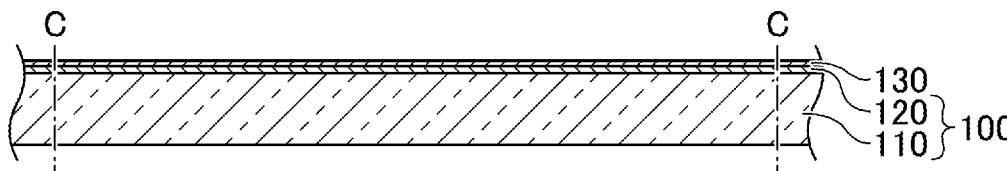

Next, in the process illustrated in FIG. 2B, a seed layer 130 is formed on the entirety of the upper surface of the carrier-attached metal foil 120 of the support 100 by electroless plating or sputtering. Examples of materials for the seed layer 130 include copper. The thickness of the seed layer 130 may be, for example, approximately 100 nm to approximately 400 nm.

Figure 2C:
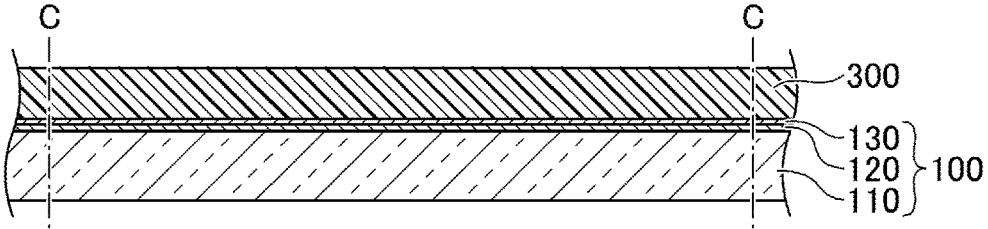
Figure 2D:
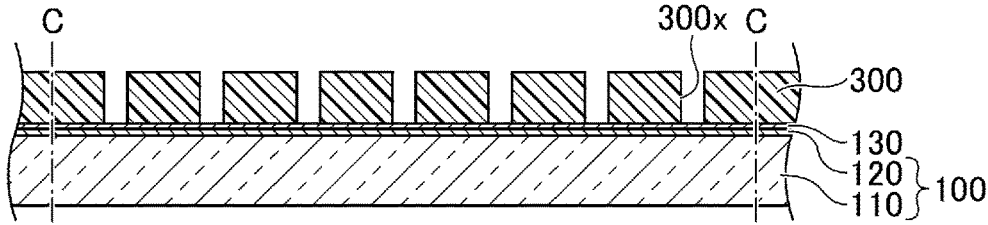

Next, in the process illustrated in FIGS. 2C through 2F, the metal posts 11 are formed on the support 100. First, as illustrated in FIG. 2C, a resist layer 300 is famed on the seed layer 130. The resist layer 300 may be famed by, for example, laminating the upper surface of the seed layer 130 with a dry film resist formed of a photosensitive resin. Then, as illustrated in FIG. 2D, the resist layer 300 is patterned, being exposed to light and developed, so that openings 300x that expose the upper surface of the seed layer 130 are formed where the metal posts 11 are to be formed in the resist layer 300.

Figure 2E:
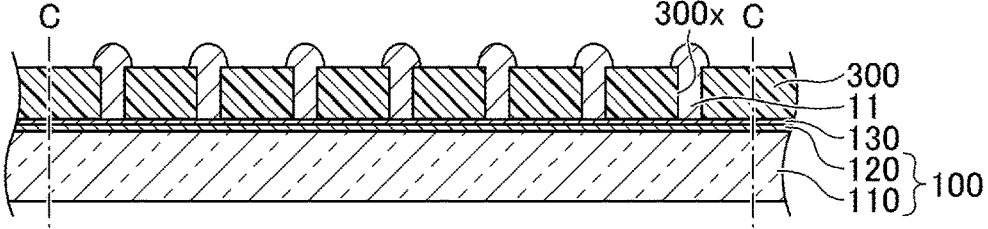
Figure 2F:
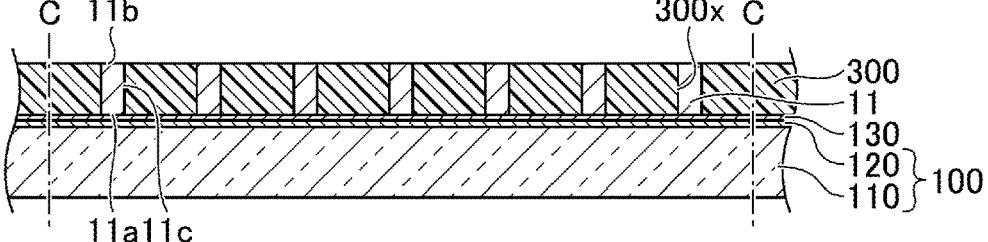

Next, as illustrated in FIG. 2E, copper or the like is deposited in the openings 300x of the resist layer 300 by electroplating using the seed layer 130 as a power supply layer to form the metal posts 11 that fill in the openings 300x. In this process, copper or the like is deposited until the metal posts 11 protrude from the upper surface of the resist layer 300. Next, as illustrated in FIG. 2F, the portions of the metal posts 11 protruding from the upper surface of the resist layer 300 are removed, so that the metal posts 11 are flattened. As a result, the metal posts 11 each having the first end face 11a, the second end face 11b, and the side surface 11c connecting the first end face 11a and the second end face 11b are formed on the support 100 with the first end face 11a facing toward the support 100. Flattening may be performed by, for example, chemical etching or the like.

Figures 2G, 2H:
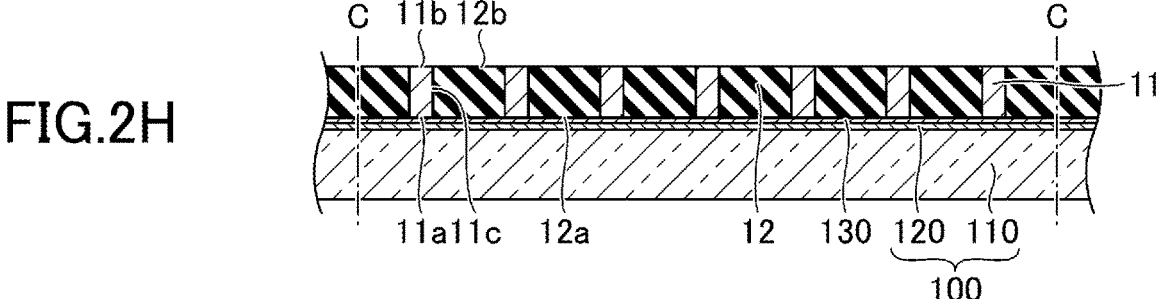

Next, in the process illustrated in FIG. 2G, first, as illustrated at the top of FIG. 2G, the structure illustrated in FIG. 2F is placed inside a vacuum chamber 400. Next, as illustrated in the middle of FIG. 2G, the resist layer 300 is removed in the vacuum chamber 400. The resist layer 300 may be removed by, for example, dry etching or the like. Next, as illustrated at the bottom of FIG. 2G, the inorganic insulating layer 12 is formed on the support 100 so as to cover the second end faces 11b and the side surfaces 11c of the metal posts 11.

The inorganic insulating layer 12 may be formed by CVD, using, for example, $SiO_2$, SiOC or the like. The inorganic insulating layer 12 may also be formed by ALD, using, for example, hafnia, titania, zirconia, or the like. The inorganic insulating layer 12 may have either a two-layer structure where a CVD layer and an ALD layer are stacked in layers or a three-layer structure where a CVD layer is sandwiched between ALD layers. When the inorganic insulating layer 12 has a layered structure of a CVD layer and an ALD layer, the thickness of the ALD layer may be, for example, approximately 10 nm to approximately 20 nm, and the rest is the CVD layer.

Thus, the process of removing the resist layer 300 and the process of forming the inorganic insulating layer 12 covering the second end faces 11b and the side surfaces 11c as illustrated in FIG. 2G are a series of processes executed in the vacuum chamber 400. That is, the resist layer 300 is removed in the vacuum chamber 400 immediately before forming the inorganic insulating layer 12, and the inorganic insulating layer 12 is formed in the same vacuum chamber 400 immediately after the resist layer 300 is removed. This makes it possible to easily embed the metal posts 11 in the inorganic insulating layer 12 without damaging the metal posts 11, which are fine and delicate, during conveyance. In other words, using the above-described process enables miniaturization of the metal posts 11.

It may be possible to form the inorganic insulating layer 12 before forming the metal posts 11, form through holes in the inorganic insulating layer 12, and forming the metal posts 11 in the through holes by plating or the like. According to this process, however, the sidewalls of the through holes and the side surfaces 11c of the metal posts 11 do not closely adhere to each other, thus resulting in less reliability. In contrast, according to the process illustrated in FIG. 2G, the inorganic insulating layer 12 is formed with the metal posts 11 being already formed. Therefore, the metal posts 11 can easily be embedded into the inorganic insulating layer 12 without forming through holes or the like in the inorganic insulating layer 12. According to this process, it is possible to ensure adhesion and airtightness between the side surfaces 11c of the metal posts 11 and the inorganic insulating layer 12.

Next, in the process illustrated in FIG. 2H, the upper surface of the inorganic insulating layer 12 is ground to expose the second end faces 11b of the metal posts 11. As a result, the inorganic insulating layer 12 having the first surface 12a, in which the first end faces 11a of the metal posts 11 are exposed, and the second surface 12*b*, in which the second end faces 11*b* of the metal posts 11 are exposed, and covering the side surfaces 11*c* of the metal posts 11 is formed on the support 100. For example, chemical mechanical polishing (CMP) or dry etching may be employed for the grinding. The second surface 12*b* of the inorganic insulating layer 12 may be flush with the second end faces 11*b* of the metal posts 11, for example. The roughness of the second surface 12*b* of the inorganic insulating layer 12 may be, for example, an arithmetic average roughness (Ra) of approximately 20 nm or less.

Figure 2I:
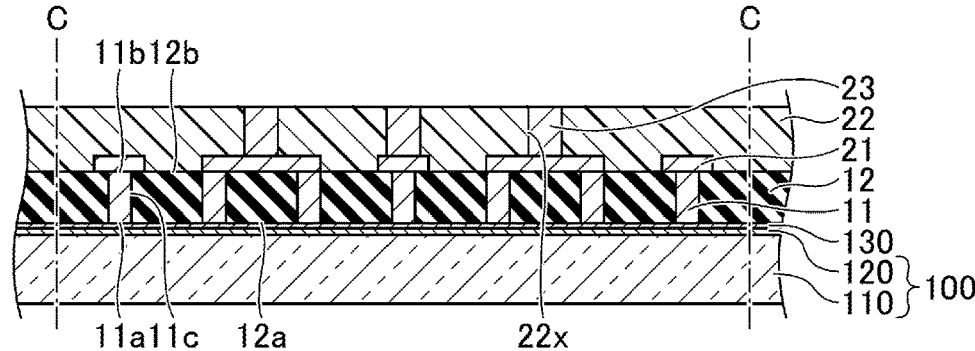
Figure 2J:
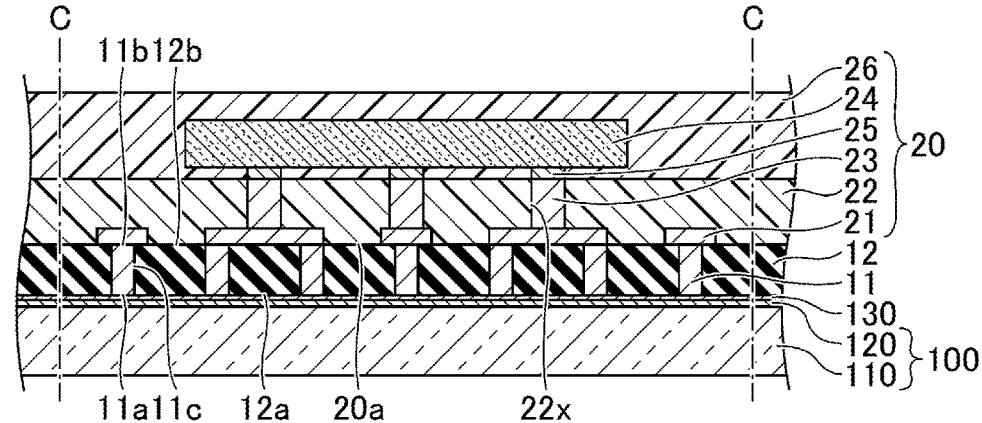

Next, in the process illustrated in FIGS. 2I and 2J, the semiconductor chip mounting part 20, which is stacked on the second surface 12*b* of the inorganic insulating layer 12 such that the lower surface 20*a* of the semiconductor chip mounting part 20 contacts the second surface 12*b*, is famed. First, as illustrated in FIG. 2I, the wiring layer 21, the insulating layer 22, and the wiring layer 23 are successively formed on the inorganic insulating layer 12. The wiring layer 23 may be famed with, for example, a semi-additive process.

Specifically, first, a seed layer of copper or the like is formed on the second surface 12*b* of the inorganic insulating layer 12 and the second end faces 11*b* of the metal posts 11 by electroless plating or sputtering. Next, a resist layer having openings corresponding to the wiring layer 21 is formed on the seed layer. Then, an electroplating layer of copper or the like is formed in the openings of the resist layer by electroplating using the seed layer as a power supply layer. Next, after removing the resist layer, a portion of the seed layer not covered with the electroplating layer is etched away, using the electroplating layer as a mask. As a result, the wiring layer 21 in which the electroplating layer is stacked on the seed layer is formed.

To form the insulating layer 22, for example, a photosensitive insulating resin in liquid or paste form is prepared and is applied on the second surface 12*b* of the inorganic insulating layer 12 by spin coating or the like in such a manner as to cover the wiring layer 21. Alternatively, a photosensitive insulating resin in film form may be prepared and applied as a lamination on the second surface 12*b* of the inorganic insulating layer 12 in such a manner as to cover the wiring layer 21. Then, the applied photosensitive insulating resin is heated to form the insulating layer 22 in a semi-cured state.

Next, the via holes 22*x*, which pierce through the insulating layer 22 to expose the upper surface of the wiring layer 21, are formed by photolithography. Then, the wiring layer 23 filling in the via holes 22*x* is formed with, for example, a semi-additive process. The wiring layer 23 may be famed to protrude from the upper surface of the insulating layer 22. In this case, the wiring layer 23 is flattened by removing a portion of the wiring layer 23 protruding from the upper surface of the insulating layer 22 by CMP or the like. As a result, the upper surface of the insulating layer 22 is flush with the upper surface of the wiring layer 23.

Next, as illustrated in FIG. 2J, the semiconductor chip 24 including the electrodes 25 is mounted and the encapsulating resin layer 26 covering the semiconductor chip 24 is formed on the insulating layer 22. As a result, the semiconductor chip mounting part 20 is formed. The semiconductor chip 24 is mounted such that the electrodes 25 are electrically connected to the upper surface of the wiring layer 23. The encapsulating resin layer 26 is so formed as to cover the bottom surface and the side surface of the semiconductor chip 24 and fill in the gap between the circuit-formation surface 24*a* of the semiconductor chip 24 and the upper surface of the insulating layer 22. The encapsulating resin layer 26 may be famed with a molding process using a mold resin, for example. Examples of molding processes include transfer molding, compression molding and injection molding. Through the processes of FIGS. 2A through 2J, multiple parts (parts each sandwiched between adjacent separation positions C) to be separated into individual semiconductor devices 1 are formed on the support 100.

Figure 2K:
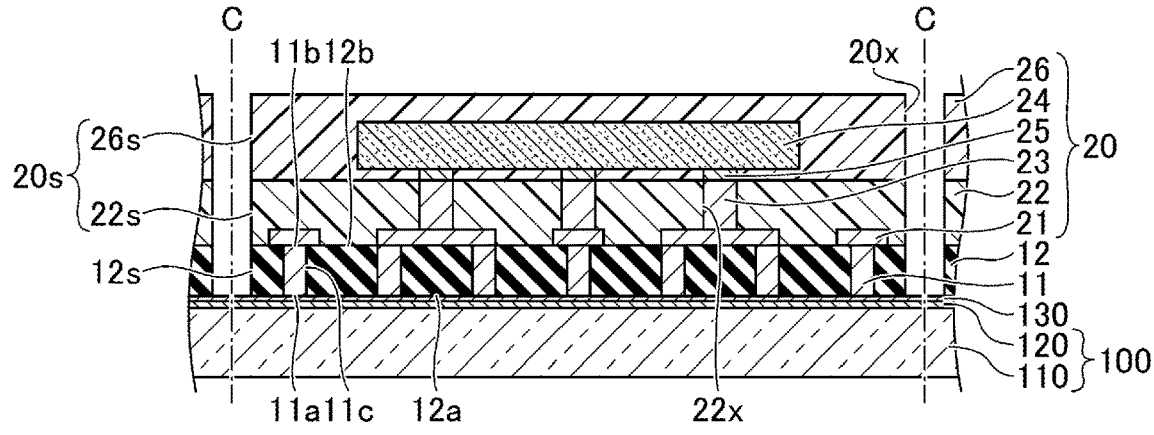

Next, in the process illustrated in FIG. 2K, grooves 20*x* that separate the multiple parts to become the semiconductor devices 1 are formed in the structure illustrated in FIG. 2J. The grooves 20*x* are so formed with a dicer or the like as to include the separation positions C. Cutting for forming the grooves 20*x* is so performed as to expose at least the side surface 12*s* of the inorganic insulating layer 12 and the side surface 20*s* of the semiconductor chip mounting part 20. That is, the grooves 20*x* pierce through at least the encapsulating resin layer 26, the insulating layer 22, and the inorganic insulating layer 12 to expose the side surface 12*s* of the inorganic insulating layer 12, the side surface 22*s* of the insulating layer 22, and the side surface 26*s* of the encapsulating resin layer 26. The grooves 20*x* may be, for example, approximately 200 µm to approximately 1000 µm in width.

Figure 2L:
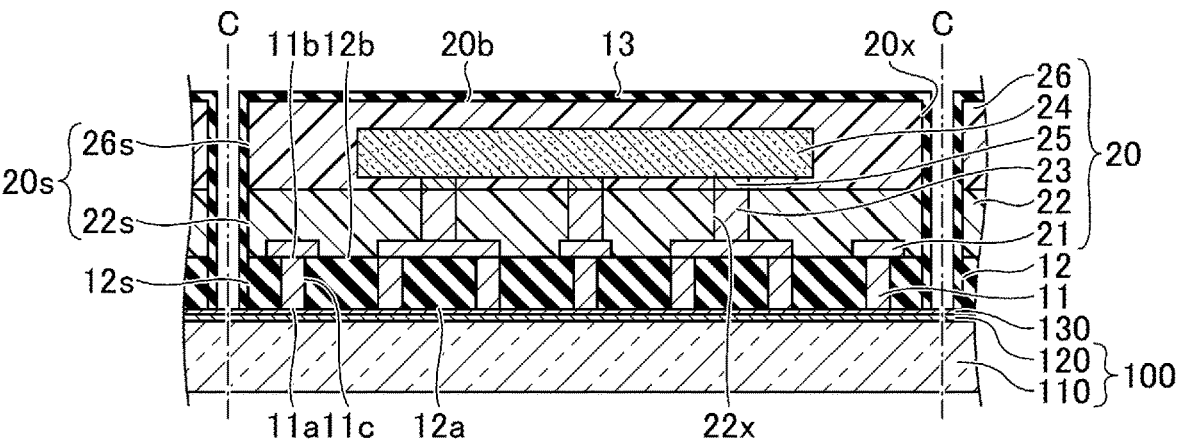

Next, in the process illustrated in FIG. 2L, the inorganic insulating layer 13 that covers the entirety of the upper surface 20*b* and the entirety of the side surface 20*s* of the semiconductor chip mounting part 20 and is continuous with the inorganic insulating layer 12 is formed. Here, the upper surface 20*b* and the side surface of the semiconductor chip mounting part 20 refers to the upper surface of each of the multiple parts to become the semiconductor devices 1 and the side surface of each of the multiple parts to become the semiconductor devices 1 exposed in the grooves 20*x*. That is, in each of the multiple parts to become the semiconductor devices 1, the inorganic insulating layer 13 is so formed as to continuously cover the side surface 22*s* of the insulating layer 22 and the upper surface and the side surface 26*s* of the encapsulating resin layer 26. The inorganic insulating layer 13 may be famed by CVD or ALD the same as the inorganic insulating layer 12, for example. The material of the inorganic insulating layer 13 may be the same as the material of the inorganic insulating layer 12. The inorganic insulating layer 13 may have either a two-layer structure where a CVD layer and an ALD layer are stacked in layers or a three-layer structure where a CVD layer is sandwiched between ALD layers.

Figure 2M:
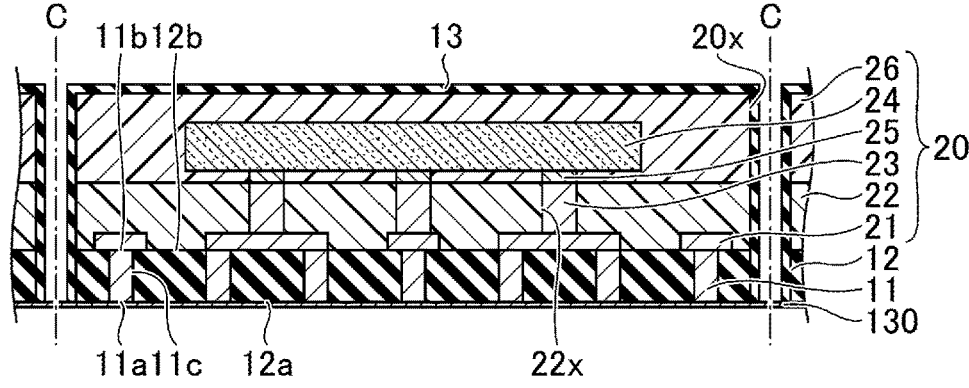
Figure 2N:
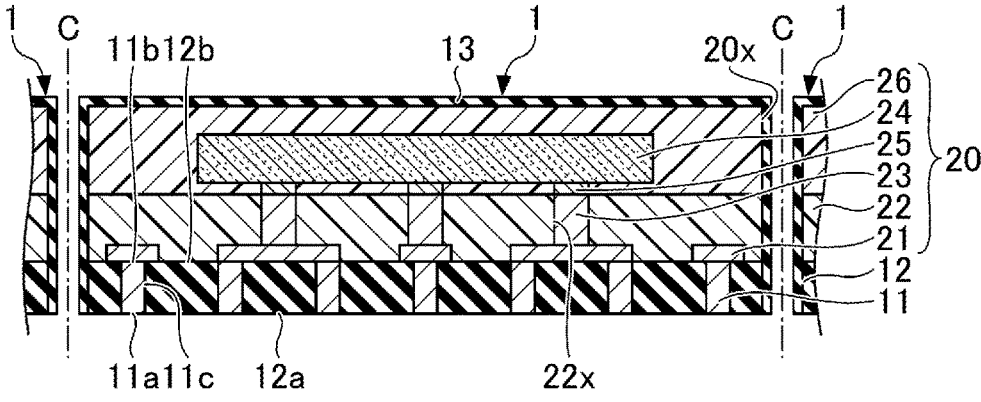

Next, in the process illustrated in FIG. 2M, the support 100 is removed from the structure illustrated in FIG. 2L. For example, when the carrier-attached metal foil 120 has a structure where thick foil is adhered to thin foil through a release layer, a mechanical force is applied to the support 100 to delaminate the carrier-attached metal foil 120 at the interface of the thin foil and the thick foil. The thick foil is easily removed from the thin foil together with the release layer. Thereafter, the thin foil is etched away.

Next, in the process illustrated in FIG. 2N, the seed layer 130 is removed from the structure illustrated in FIG. 2M. The seed layer 130 may be, for example, etched away. As a result, the individual semiconductor devices 1 are completed.

Thus, the semiconductor device 1 is entirely covered with the inorganic insulating layer 12 or 13 except for the first end faces 11*a* of the metal posts 11. This makes it possible to impart moisture resistance and a gas barrier property (mainly a gas barrier property against oxygen) to the entirety of the semiconductor device 1 except for the first end faces 11*a* serving as external connection terminals. Accordingly, it is possible to improve the moisture-proof effect and the gas barrier property.

Figure 3:
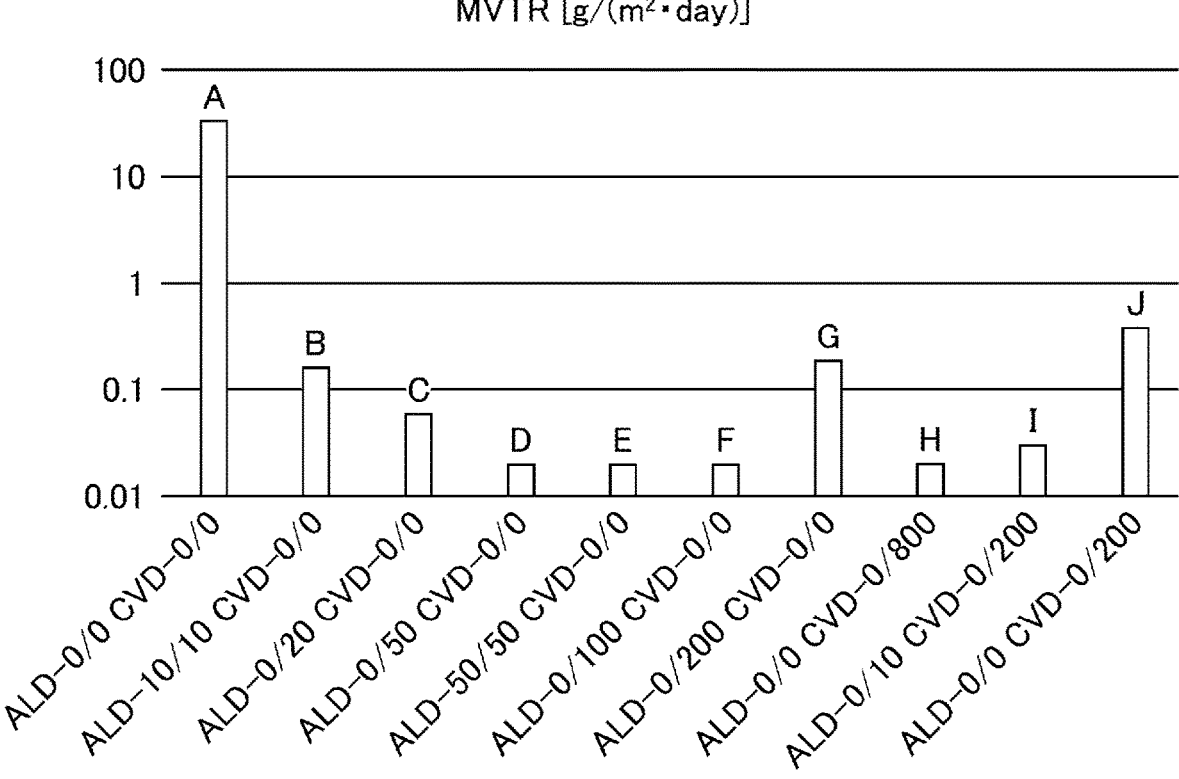
FIG. 3 is a diagram illustrating the results of examining the moisture resistance of inorganic insulating layers.

Here, the moisture resistance of an inorganic insulating layer is described. The inventor of the present invention studied the relationship between layer thickness and moisture resistance with respect to an ALD layer, a CVD layer, and an ALD/CVD composite layer in which an ALD layer and a CVD layer are stacked in layers. Specifically, the above-noted layers of various thicknesses were formed one on each polyimide film, and their respective moisture vapor transmission rates (MVTRs) were measured according to the Mocon test method. FIG. 3 and Table 1 illustrate the results of examining the moisture resistance of inorganic insulating layers.

In FIG. 3 and Table 1, for example, "ALD-10/10 CVD-0/0" represents the case where ALD layers each having a thickness of 10 nm are stacked one on each side of a polyimide film with no CVD layer formed. Furthermore, "ALD-0/20 CVD-0/0" represents the case where an ALD layer having a thickness of 20 nm is formed on one side of a polyimide film with no CVD layer formed. Furthermore, "ALD-0/10 CVD-0/200" represents a layered structure where a CVD layer (a single layer) having a thickness of 200 nm is stacked on an ALD layer (a single layer) having a thickness of 10 nm. Other notations also follow these rules.

TABLE 1

|   | LAYER TYPE & LAYER THICKNESS | MVTR [g/($m^2$ · day)] |
| --- | --- | --- |
| A | ALD-0/0 CVD-0/0 | 33.2 |
| B | ALD-10/10 CVD-0/0 | 0.16 |
| C | ALD-0/20 CVD-0/0 | 0.06 |
| D | ALD-0/50 CVD-0/0 | 0.02 |
| E | ALD-50/50 CVD-0/0 | 0.02 |
| F | ALD-0/100 CVD-0/0 | 0.02 |
| G | ALD-0/200 CVD-0/0 | 0.19 |
| H | ALD-0/0 CVD-0/800 | 0.02 |
| I | ALD-0/10 CVD-0/200 | 0.03 |
| J | ALD-0/0 CVD-0/200 | 0.38 |

Sample A illustrated in FIG. 3 and Table 1, which is a comparative example, is a sample in the case of forming no inorganic insulating layers, namely, in the case of forming neither an ALD layer nor a CVD layer. The MVTR of Sample A is 33.2 g/($m^2$·day). MVTRs at or below 0.1 g/($m^2$·day) are referred to as "Category 2" and are values required for general electronic devices.

The results of Samples B through F indicate that even in the case where only an ALD layer or ALD layers are formed, a sufficient moisture resistance is obtained compared with Sample A having no inorganic insulating layers. In particular, when the thickness of one ALD layer is 20 nm or more and 100 nm or less, the Category 2 requirement is satisfied. Furthermore, when the thickness of one ALD layer is 50 nm or more and 100 nm or less, a good MVTR that is approximately half of the MVTR in the case where the thickness of one ALD layer is 20 nm is obtained.

The result of Sample G indicates that when the thickness of one ALD layer is 200 nm, the MVTR is worse than the MVTR of Sample F, where the thickness of one ALD layer is 100 nm. This is believed to be because a crack is created in the ALD layer, which is a hard ceramic film. A sufficient moisture resistance, however, is obtained with Sample G compared with Sample A.

Furthermore, the results of Samples H and J indicate that even in the case where only a CVD layer is formed, a sufficient moisture resistance is obtained compared with Sample A having no inorganic insulating layers. In particular, when the thickness of one CVD layer is 800 nm, the Category 2 requirement is satisfied. The values of Samples D, E, F and H are less than or equal to the detection limit value, and these samples may practically exhibit MVTRs that are lower than the values illustrated in FIG. 3 and Table 1.

In addition, a comparison between Sample I and Sample J indicates that Sample I, which has an ALD/CVD composite layer, can significantly reduce the MVTR compared with Sample J, which has only a CVD layer. That is, by additionally forming an ALD layer of only 10 nm, it is possible to significantly reduce the MVTR compared with the case of forming only a CVD layer of 200 nm. This is believed to be because while a CVD layer has a certain degree of porosity, in a layered structure of a CVD layer and an ALD layer, the ALD layer enters slight gaps (holes) in the CVD layer to decrease moisture vapor permeability.

In the composite layer, the MVTR reduction effect can be obtained irrespective of whether the CVD layer or the ALD layer is the upper layer. It is preferable, however, that the ALD layer be formed at the top layer. This is because the presence of a dense film at the top layer makes it possible to reduce the absorption of water into the porous CVD layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority or inferiority of the invention. Although one or more embodiments of the present invention have been described in detail, it should be understood that the various changes, substitutions, and alterations could be made hereto without departing from the spirit and scope of the invention.

Various aspects of the subject-matter described herein may be set out non-exhaustively in the following numbered clauses:

1. A method of manufacturing a semiconductor device, including:

forming a metal post having a first end face, a second end face, and a side surface connecting the first end face and the second end face on a support such that the first end face faces toward the support;

forming a first inorganic insulating layer on the support such that the first inorganic insulating layer has a first surface in which the first end face is exposed and a second surface in which the second end face is exposed, and covers the side surface;

forming a semiconductor chip mounting part such that the semiconductor chip mounting part is stacked on the second surface of the first inorganic insulating layer with a first surface of the semiconductor chip mounting part contacting the second surface of the first inorganic insulating layer;

forming a second inorganic insulating layer such that the second inorganic insulating layer covers an entirety of a second surface and an entirety of a side surface of the semiconductor chip mounting part to be continuous with the first inorganic insulating layer, the second surface of the semiconductor chip mounting part facing away from the first surface of the semiconductor chip mounting part, the side surface of the semiconductor chip mounting part connecting the first surface and the second surface of the semiconductor chip mounting part; and removing the support.

2. The method of clause 1, wherein forming the metal post includes forming a resist layer including an opening on the support;

forming the metal post such that the metal post fills in the opening; and removing the resist layer, forming the first inorganic insulating layer includes forming an inorganic insulating layer on the support such that the inorganic insulating layer covers the second end face and the side surface of the metal post; and grinding a surface of the inorganic insulating layer facing away from the support until the second end face is exposed, and removing the resist layer and forming the inorganic insulating layer are executed as a series of processes in a vacuum chamber.

3. The method of clause 1, wherein in forming the metal post, forming the first inorganic insulating layer, and forming the semiconductor chip mounting part, a plurality of parts to be separated into individual semiconductor devices are formed on the support, forming grooves to separate the plurality of parts between forming the semiconductor chip mounting part and forming the second inorganic insulating layer, and in forming the second inorganic insulating layer, the second inorganic insulating layer is so formed as to cover an entirety of surfaces of the plurality of parts facing away from the support and an entirety of side surfaces of the plurality of parts exposed in the grooves and to be continuous with the first inorganic insulating layer.

What is claimed is:

1. A semiconductor device comprising:

a first inorganic insulating layer having a first surface and a second surface that are on opposite sides from each other;

a metal post embedded in the first inorganic insulating layer, the metal post having a first end face and a second end face that are exposed in the first surface and the second surface, respectively, of the first inorganic insulating layer;

a semiconductor chip mounting part having a first surface and a second surface that are on opposite sides from each other and a side surface connecting the first surface and the second surface of the semiconductor chip mounting part, the semiconductor chip mounting part being stacked on the first inorganic insulating layer with the first surface of the semiconductor chip mounting part contacting the second surface of the first inorganic insulating layer; and a second inorganic insulating layer covering an entirety of the second surface of the semiconductor chip mounting part and an entirety of the side surface of the semiconductor chip mounting part, the second inorganic insulating layer being continuous with the first inorganic insulating layer, wherein each of the first inorganic insulating layer and the second inorganic insulating layer is one selected from the group consisting of: one or more ALD layers; a CVD layer; and a composite layer that is a laminate of the one or more ALD layers and the CVD layer.

2. The semiconductor device as claimed in claim 1, wherein each of the one or more ALD layers is thinner than the CVD layer in the composite layer.

3. The semiconductor device as claimed in claim 1, wherein an ALD layer among the one or more ALD layers is formed on top of the CVD layer in the composite layer.

4. The semiconductor device as claimed in claim 1, wherein each of the one or more ALD layers is formed of hafnia, titania, or zirconia.

5. The semiconductor device as claimed in claim 1, wherein the CVD layer is formed of silica or silicon oxycarbide.

6. The semiconductor device as claimed in claim 1, wherein each of the one or more ALD layers has a thickness of 20 nm to 100 nm.

7. The semiconductor device as claimed in claim 1, wherein each of the one or more ALD layers has a thickness of 10 nm to 20 nm in the composite layer.

8. The semiconductor device as claimed in claim 1, wherein the semiconductor chip mounting part includes one or more wiring layers including a bottommost wiring layer stacked on the second surface of the first inorganic insulating layer and electrically connected to the second end face of the metal post;

one or more insulating layers including a bottommost insulating layer stacked on the second surface of the first inorganic insulating layer and covering the bottommost wiring layer;

a semiconductor chip disposed on a topmost insulating layer among the one or more insulating layers and including an electrode electrically connected to a topmost wiring layer among the one or more wiring layers; and an encapsulating resin layer disposed on the topmost insulating layer and covering the semiconductor chip, wherein the second inorganic insulating layer covers an entirety of a surface of the encapsulating resin layer facing away from the topmost insulating layer, an entirety of a side surface of the encapsulating resin layer, and an entirety of a side surface of each of the one or more insulating layers, and is continuous with the first inorganic insulating layer.

9. The semiconductor device as claimed in claim 1, wherein the first inorganic insulating layer has a side surface connecting the first surface and the second surface of the first inorganic insulating layer, and the second inorganic insulating layer covers the side surface of the first inorganic insulating layer.

* * * * *